United States Patent
Sparks et al.

(10) Patent No.: US 7,789,949 B2
(45) Date of Patent: Sep. 7, 2010

(54) GETTER DEVICE

(75) Inventors: Douglas Ray Sparks, Whitmore Lake, MI (US); Nader Najafi, Ann Arbor, MI (US); Bernard Edward Newman, Fenton, MI (US)

(73) Assignee: Integrated Sensing Systems, Inc., Ypsilanti, MI (US)

( * ) Notice: Subject to any disclaimer, the term of this patent is extended or adjusted under 35 U.S.C. 154(b) by 938 days.

(21) Appl. No.: 11/558,992

(22) Filed: Nov. 13, 2006

(65) Prior Publication Data

US 2007/0205720 A1    Sep. 6, 2007

Related U.S. Application Data (60) Provisional application No. 60/738,796, filed on Nov. 23, 2005, provisional application No. 60/741,345, filed on Dec. 2, 2005, provisional application No. 60/792,470, filed on Apr. 17, 2006.

(51) Int. Cl.
  *F04B 37/02* (2006.01)
  *H01J 7/18* (2006.01)

(52) U.S. Cl. ............................. 96/132; 96/153; 96/154; 252/181.2; 252/184

(58) Field of Classification Search ........... 96/109–113, 96/117.5, 134, 135, 132, 147, 148, 153, 154; 423/210, 230, 239.1, 247; 502/400, 416, 502/417; 252/184, 181.1, 181.2, 181.3, 181.4
See application file for complete search history.

(56) References Cited

U.S. PATENT DOCUMENTS

| | | | |
|---|---|---|---|
| 5,242,474 A * | 9/1993 | Herbst et al. ................... 96/397 |
| 5,288,306 A * | 2/1994 | Aibe et al. ...................... 95/141 |
| 5,772,738 A * | 6/1998 | Muraoka ........................ 96/129 |
| 5,985,169 A * | 11/1999 | Miller et al. ............ 252/188.28 |
| 6,074,459 A * | 6/2000 | Gingrich et al. ................ 95/118 |
| 6,295,861 B1 * | 10/2001 | Tom et al. ................... 73/24.06 |
| 7,132,007 B1 * | 11/2006 | von Blucher et al. ........... 95/90 |
| 7,163,573 B2 * | 1/2007 | Ham et al. ...................... 96/131 |
| 2002/0078828 A1 * | 6/2002 | Kishkovich et al. ........... 96/108 |
| 2003/0138656 A1 * | 7/2003 | Sparks ........................ 428/615 |
| 2004/0129143 A1 * | 7/2004 | Kvietok et al. ................. 96/134 |
| 2004/0217049 A1 * | 11/2004 | Bayer et al. ............ 210/500.36 |

* cited by examiner

*Primary Examiner*—Frank M Lawrence
(74) *Attorney, Agent, or Firm*—Hartman & Hartman, P.C.; Gary M. Hartman; Domenica N. S. Hartman (57) ABSTRACT

A getter device including a substrate formed of a first getter material having a composition for gettering a first gas species, and a second getter material contacting an external surface of the substrate and having a composition for gettering a second gas species. The substrate has internal porosity connected to openings at its external surface, and the second getter material covers at least a portion of the external surface of the substrate but is absent from at least part of the internal porosity within the substrate so that the first getter material is exposed within the internal porosity for gettering the first gas species. According to a second aspect, a substrate is formed of a material transparent to radiation, and a film of getter material is deposited on the substrate to be sufficiently thin and/or porous so that the film is also transparent to the radiation transmitted through the substrate.

27 Claims, 5 Drawing Sheets

GETTER DEVICE

CROSS REFERENCE TO RELATED APPLICATIONS

This application claims the benefit of U.S. Provisional Application No. 60/738,796 filed Nov. 23, 2005, Ser. No. 60/741,345 filed Dec. 2, 2005, and Ser. No. 60/792,470 filed Apr. 17, 2006, the contents of which are incorporated herein by reference.

BACKGROUND OF THE INVENTION

The present invention generally relates to gettering materials and devices for gettering gases, such as within a gas stream or a closed chamber. More particularly, this invention relates to gettering devices capable of being more versatile and/or more reliable in a variety of applications.

The use of certain materials to remove or "getter" gases is a well-known technique for improving the performance of devices whose operations require or benefit from an evacuated enclosed volume or space or the selective removal of one or more particular gas species. As used herein, a getter material is a composition that absorbs, reacts, or otherwise combines with gas molecules to remove the gas molecules from a flowing gas stream (in which case the getter may be called a filter) or a sealed and typically evacuated chamber (in which case the getter is employed to lower or maintain low pressures and improve the performance of a device containing or operating within the chamber). Representative getter applications include micromachined devices (for example, MEMS wafers), vacuum tubes, cathode ray tubes, vacuum display devices, flat panel displays, resonant sensors, tunneling sensors, flow sensors, motion sensors (for example, inertial sensing platforms, angular rate sensors, and accelerometers), gyroscopes (including resonating gyroscopes and fiber optic gyroscopes (FOG)), pressure sensors, infrared (IR) sensors, chemical sensors, atomic interferometer (AI) sensors, resonators, ion accelerators, lighting devices, gas filters, solid-state vacuum pumps, micro-mirror arrays, personal protection air purification systems (for example, gas masks), density meters, rf-resonators for communication devices (for example, RF-MEM's), gas purification systems, atomic and resonant clocks, semiconductor equipment, scientific vacuum systems (for example, particle accelerators and analysis tools), etc. When employed for displays and optical sensor applications, getter materials are typically opaque metal films, particles, strips or pellets whose placement must then be controlled to avoid blocking the emission or transmission of the radiation of interest, such as infrared, optical, radio, etc.

Getters are typically employed in the form of evaporated films, sputtered films, and sintered non-evaporable getters (NEG's) such as pellets and strips. Oxygen, air, and water vapor are typically gettered (reacted) with chemically active or reactive metals or alloys, such as Ba, Mg, Ti, Zr, Fe, Cr, Ca, etc. In contrast, organic gases are typically gettered (absorbed) by activated charcoal, silica, or zeolite. Under some circumstances, such as when one or more organic gases and oxygen, air, and/or water vapors require gettering, multiple different getter materials must be employed.

Once enclosed in a vacuum or otherwise placed in the space to be gettered, getter materials often must be "activated," by which absorbed gas molecules are desorbed and/or oxidation and surface contaminates are removed, such as by a high temperature vacuum bake, chemical etch, or exposure to a forming or reducing gas such as hydrogen or a carbon-based reducing gas. The life of a getter material is typically limited in that the chemical reactivity or absorbent qualities of getter materials decline over time as the getter gas molecules combine or absorb onto the surface of the getter. If the capacity of the getter material is exceeded, the getter will no longer remove the gases of interest, necessitating (if possible) regeneration of the getter material through an additional activation treatment.

BRIEF SUMMARY OF THE INVENTION

The present invention provides getter devices with improved properties and/or performance characteristics for a wide variety of applications.

According to a first aspect of the invention, a getter device includes a substrate formed of a first getter material having a composition for gettering a first gas species, and a second getter material contacting an external surface of the substrate and having a composition for gettering a second gas species different from the first. The substrate has internal porosity connected to openings at its external surface, and the second getter material covers at least a portion of the external surface of the substrate but is absent from at least a portion of the internal porosity of the substrate. As such, the first getter material is exposed within the internal porosity of the substrate for gettering the first gas species and the second getter material is exposed on the external surface of the substrate for gettering the second gas species.

According to a second aspect of the invention, a getter device includes a substrate that is transparent to at least one type of radiation and is exposed to the radiation such that the radiation passes through the substrate from a first surface thereof to a second surface thereof. A film is present on at least one of the first and second surfaces of the substrate, and is formed of a getter material that reacts or absorbs a gas species. At least a portion of the film is sufficiently thin and/or porous so that the film portion is also transparent to the radiation transmitted through the substrate.

According to a third aspect of the invention, a getter device includes a getter material and a mass having a composition for gettering at least one gas species, means for sensing a change in at least one property of the mass, and means for signaling that the change has exceeded a predetermined threshold for the property. In this manner, the life or efficacy of the getter material can be monitored by correlating changes in properties of the mass with changes in properties of the getter material. Such a correlation can be promoted by forming the mass of the same material as the getter material.

Significant advantages of the present invention include the ability to provide gettering of multiple different gas species, including simultaneous gettering of organic and inorganic gas molecules. The invention also allows for the use of gettering materials in applications and locations where the opacity of a gettering material would otherwise prohibit its use or diminish the performance or other desirable features of the device in which the gettering material is to be used.

Other objects and advantages of this invention will be better appreciated from the following detailed description.

DETAILED DESCRIPTION OF THE INVENTION

Figure 1:
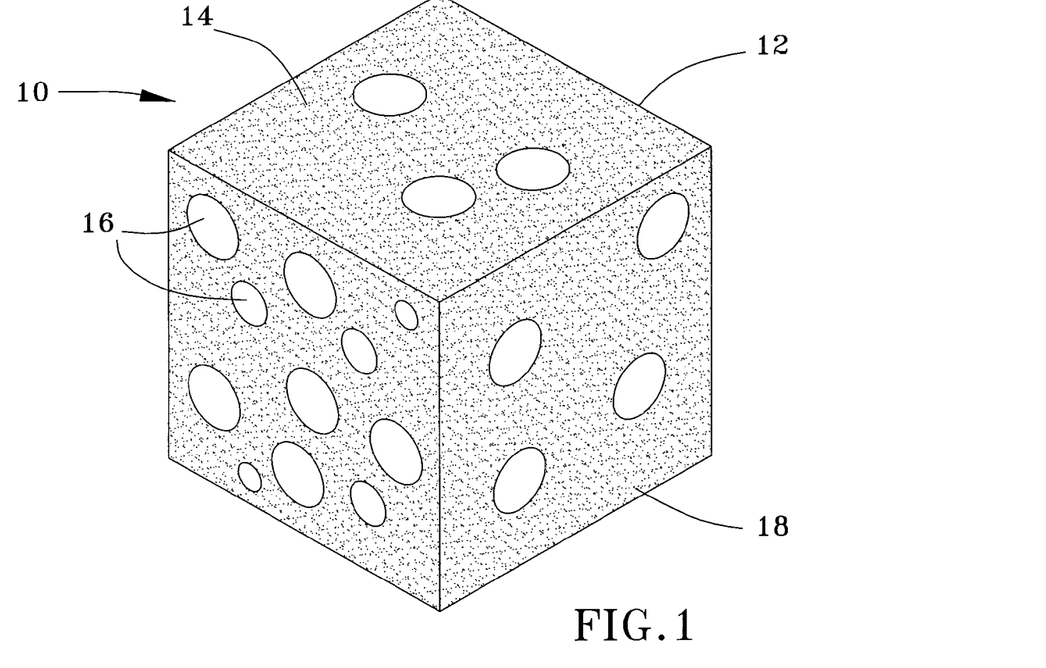
FIGS. 1 and 2 schematically represent perspective and cross-sectional views of a getter device that includes a porous body on whose external surface a shell-like film coating has been applied, in which the porous body and film coating are formed of different getter materials in accordance with an embodiment of the present invention.
Figure 2:
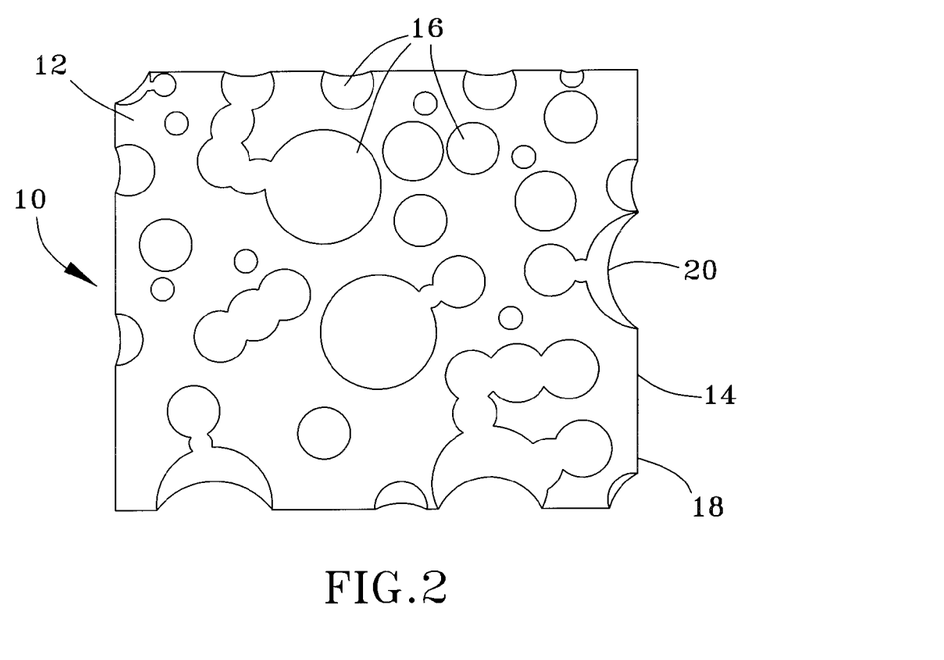
Figure 3:
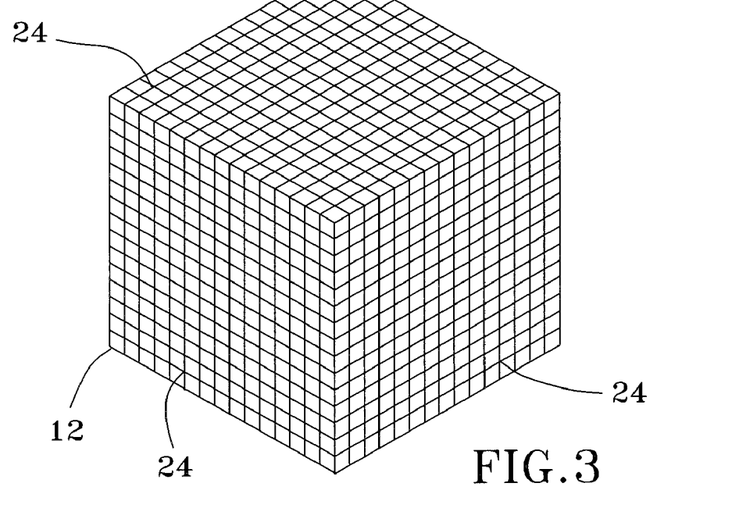
FIG. 3 schematically represents a getter device that includes a porous body and a screen surrounding the external surface of the porous body, in which the porous body and screen are formed of different getter materials in accordance with an embodiment of the present invention.

FIGS. 1 through 3 represent getter devices according to a first aspect of the invention, in which two or more different gas species can be simultaneously gettered. The getter devices are particularly suitable for use in sealed chambers, such as of the type used in vacuum packaging, and for use in gas streams, such as for purifying gases, though other usages are also within the scope of the invention. The getter devices of FIGS. 1 through 3 combine a bulk-type porous getter material with a second getter material provided in the form of a deposited thin film or screen covering at least a portion of the porous getter material.

In FIGS. 1 and 2, a getter device 10 is shown as including a relatively porous substrate or body 12 on whose external surface 18 a film 14 has been applied, preferably though not necessarily covering the entire external surface 18 of the porous body 12. The porous body 12 and film 14 are both formed to at least contain a getter material, and are preferably formed entirely of getter materials. The getter materials of the body 12 and film 14 are preferably different to provide the capability of gettering at least two different gas species. Various getter materials are within the scope of the invention, generally encompassing those materials that readily absorb and/or react with one or more of the following: oxygen, hydrogen, nitrogen, water or water vapor, carbon monoxide, carbon dioxide, and organic molecules. In a particularly preferred embodiment, the porous body 12 is formed of a getter material capable of absorbing organic molecules, such as hydrocarbons, while the film 14 is formed of a getter material capable of reacting oxygen, air, and/or water vapors. Suitable materials for the porous body 12 include but are not limited to activated charcoal, zeolite, silica gel, polymeric materials, molecular sieve materials, nonevaporable getters (NEG's), sintered metallic powders, ceramics, and combinations thereof. Suitable materials for the film 14 include but are not limited to reactive transition metals, Group IA, IIA, IIIB, IVB, VB, VIB, VIIB, VIII, IB, IIB, IIIA, IVA elements of the periodic table, metal oxides, ceramics, carbon, carbon nanotubes, diamond, activated charcoal/carbon, and combinations thereof. Particularly suitable materials for the film 14 are believed to be barium, magnesium, titanium, zirconium, iron, chromium, carbon, calcium, and combinations thereof.

The porous body 12 can be formed, machined, sintered, or cut to essentially any desired size and shape, including the cube shown in FIGS. 1 and 2 as well as a panel, cylinder, sphere, or any shape necessary to allow the getter device 10 to fit within the environment it will be used. As a porous bulk, the body 12 contains internal porosity, represented in FIG. 2 as pores 16, some of which are interconnected. The porosity shown in FIGS. 1 and 2 is merely intended to be schematically representative. Other potential features associated with the porosity include cracks and crevices, some of which may interconnect with the pores 16 and the surface 18 of the body 12. This network of pores 16, cracks, etc., within the body 12 and extending to the external surface 18 of the body 12 create what can be termed open porosity. The porosity within the body 12 can be formed in situ as a result of various processes by which the body 12 can be initially formed, including sintering, powder metallurgy, compaction, hot pressing, and weaving processes. The porosity can be increased or decreased by adopting appropriate additional processing steps, such as sintering, cold or hot pressing, laminating, using foam, sponge, grinding machining, and crushing.

As depicted in FIG. 2, the film 14 is deposited on the porous body 12 to directly adhere to its external surface 18. Suitable deposition techniques include evaporation, sputtering, chemical vapor deposition, etc. The film 14 can be deposited on the porous body 12 of FIGS. 1 and 2, as well as bodies with other shapes that include flat external surfaces, by mounting the body 12 in a fixture capable of rotating the body 12 in a deposition chamber to insure that all external surfaces of the body 12 are coated. If formed to have a more cylindrical or spherical shape, the body 12 can be coated while rolling in a deposition chamber to insure that all sides of the body 12 are coated. The film 14 can be deposited as a single continuous layer covering the entire external surface 18 of the body 12, or discontinuous layers covering limited portions of the surface 18. Alternatively, the film 14 can be patterned so that more than one type of getter material is present in the film 14. For example stripes of titanium alternated with stripes of iron and zirconium could be patterned on the external surface 18 to enable the film 14 to getter multiple gases. Following deposition of the film 14, the getter materials of the porous body 12 and film 14 can be activated as needed by, for example, a high temperature vacuum bake, chemical etch, or exposure to a forming or reducing gas such as hydrogen or a carbon-based reducing gas, depending on the particular getter materials used.

As known in the art, shadowing effects that occur with the above-noted deposition techniques minimize deposition of the film 14 on the interior surfaces of the porous body 12 formed by the pores 16 and other internal features within the body 12. As a result, the uncoated surfaces of the pores 16 provide a large getter capacity within the body 12, access to which is through the pore openings at the external surface 18 of the body 12, which allow gases to travel into the interior of the body 12. If desired, gas transport into the interior of the porous body 12 can be increased by forming additional openings in the external surface 18, such as by physical piercing or chemical etching of the device 10 after deposition of the film 14. With access to the getter material within the interior of the porous body 12, more than one type of gas molecule can be gettered with the getter device 10, namely, those gas species gettered by the getter material(s) of the film 14 on the external surface 18 of the porous body 12, and those gas species gettered by the getter material(s) of the body 12 exposed within the porosity of the body 12. As one example, the getter device 10 can be formed so that organic molecules are gettered (absorbed) by the porous body 12 (for example, formed of an activated charcoal), while oxygen and water vapor can be gettered (reacted) by the film 14 (for example, formed of a reactive metal).

As can be appreciated from FIG. 2, the film 14 has the ability to serve as a packaging wall for the porous body 12, which may be brittle. If formed of a suitable material to have a suitable thickness, for example, at least one micrometer, the film 14 is capable of providing mechanical strength and reducing damage and particle emission from the porous body 12. As also evident from FIG. 2, the porous nature of the body 12 may cause the deposited film 14 to form membranes 20 over the concave surface regions on the body 12 formed by the pores 16 at the body surface 18. The membranes 20 are depicted as being generally concave and therefore somewhat porous and/or thinner than the film 14 deposited directly on the surface 18 of the body 12. If sufficiently thin and/or porous, the membranes 20 are capable of acting as a filter, trapping particles within the interior porosity of the body 12 while still permitting ingress of gases into the porosity of the body 12.

While various combinations of materials for the porous body 12 and film 14 are possible, Table I identifies particular combinations that are believed to be illustrative of desirable combinations for a variety of getter applications.

TABLE I

| Film 14 | Porous Body 12 |
| --- | --- |
| Ti | Activated Charcoal |
| Ti | Zeolite |
| Zr | Activated Charcoal and/or Zeolite |
| Fe | Activated Charcoal and/or Zeolite |
| Cr | Activated Charcoal and/or Zeolite |
| Ti and Zr | Activated Charcoal and/or Zeolite |
| Ti and Fe | Activated Charcoal and/or Zeolite |
| Ti, Fe, and Zr | Activated Charcoal and/or Zeolite |
| Ti, Zr, and Cr | Activated Charcoal and/or Zeolite |
| Au on Ti, Fe, Zr and/or Cr | Activated Charcoal and/or Zeolite |
| Mg, Ba and/or Ca | Activated Charcoal and/or Zeolite |
| Ti, Zr, Cr, and V | Activated Charcoal and/or Zeolite |
| Carbon | Sintered Ti, Fe, Cr and or Zr |
| Carbon | Zeolite or other metal oxide |
| Carbon | Sintered metals and metal oxides |

As represented in FIG. 3, instead of or in addition to the deposited film 14, the getter device 10 can be provided with a getter material in the form of a screen 24 wrapped around the exterior of the porous body 12. The aperture size of the screen 24 is preferably sufficiently small, for example, less than three micrometers, to enable the screen 24 to serve as a particle filter for trapping any particulate that has broken free within the interior of the porous body 12. Particularly suitable materials for the screen 24 are believed to be metals such as titanium, iron, zirconium, chromium, and alloys thereof, which are sufficiently deformable to permit the screen 24 to be physically wrapped around the porous body 12 (with or without the film 14). Such metal screens 24 can be activated by a chemical etch or exposure to a forming or reducing gas such as hydrogen or a carbon-based reducing gas.

Figure 4:
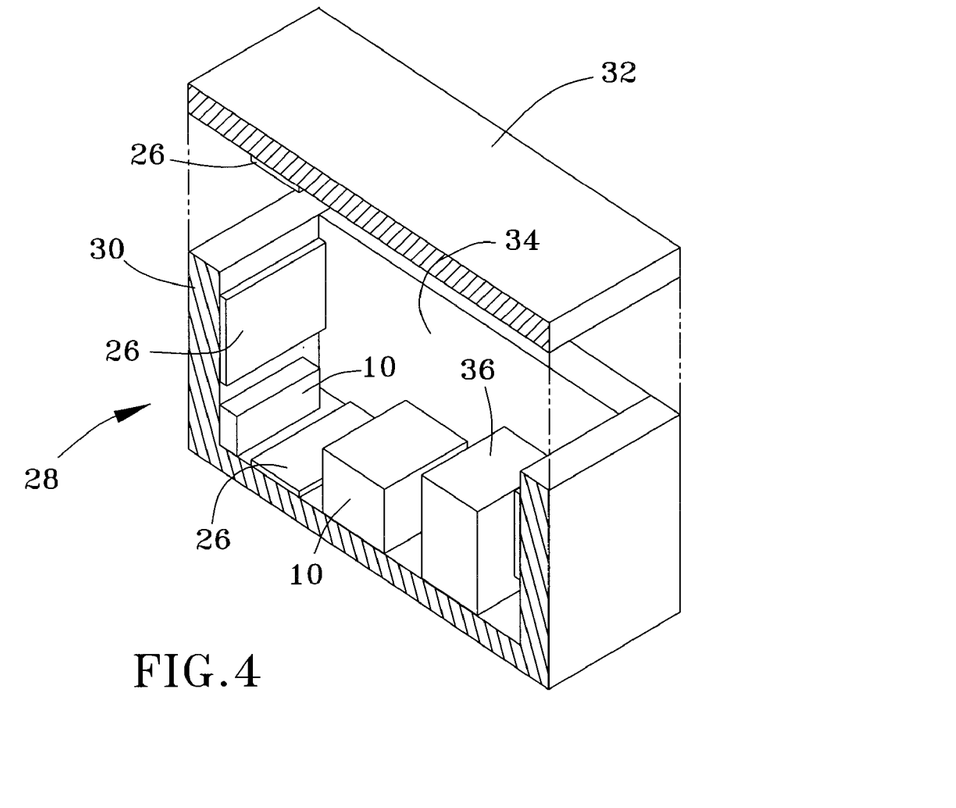
FIG. 4 schematically represents a housing containing getter devices of the types shown in FIGS. 1, 2, and 3.

FIG. 4 illustrates the use of getter devices 10 of this invention in a chamber 34 of a sealed package 28 that contains a sensor/electronic device 36. The package 28 can be formed of a variety of materials, including but not limited to silicon, ceramics, glass materials, fiberglass printed circuit boards, plastics, and coated metals (e.g., porcelain steel, painted metals, coated metals). If the device 10 is equipped with the film 14 of FIGS. 1 and 2, the film 14 can be used to attach the device 10 to an interior surface of the package 28 (or any other structure within the package 28) with, for example, solder, an adhesive such as an epoxy, screws, bolts, or brackets. To avoid contamination of the chamber 34 from outgassing, organic adhesives should be avoided. To promote adhesion, the getter devices 10 may require an additional metal that can be wire-bonded or soldered to the device 10 to form a bond pad. FIG. 4 also shows conventional thin film getters 26 deposited on inner surfaces of the package 28, including its main housing 30 and lid 32. Such thin film getters 26 can be formed of any of the aforementioned getter materials in any desired combination. As an example, a thin film getter 26 of titanium or another reactive metal can be deposited on the lid 32 and thin film getters 26 formed of activated carbon can be deposited on the inner walls of the housing 30.

In the embodiment of FIG. 4, the lid 32 is preferably sealed to the housing 30 to hermetically seal the chamber 34. Depending on the particular application for the package 28, and particularly the operation of the device 36, the housing 30 can be evacuated, or evacuated and then backfilled with an inert gas, or partially evacuated to reduce the pressure within the chamber 34. Activation of the getter materials can be performed during evacuation or pumping down of the chamber 34, or during or after sealing the lid 32 to the housing 30. As known in the art, activation can be performed by heating, such as Joule heating, electron beam heating, or conductive, radiative, or indirect heating to improve the efficiency of the getter material. As one example, heat applied to bond and seal the lid 32 to the housing 30 (for example, by reflowing glass frit, soldering, brazing, or welding) can serve to activate the getter devices 10 and react any trapped gases. Another example is to wirebond a serpentine or striped patterned thin film metal to the getter devices 10 (and film getters 26) to enable heating with electrical current at any time during the life of the package 28. Heating can be performed periodically or in response to a built-in manometer (pressure sensor) to maintain the pressure within the chamber 34 below a specific level, and thus insure the long-term vacuum quality of the chamber 34. Heating can also be performed to increase the reactivity of the getter materials toward one or more gas species of interest.

FIG. 4 is schematically representative of a wide variety of potential applications, including resonant and tunneling sensors, MEMS and microdevices, vacuum display devices, flow sensors, gyroscopes, inertial sensing platforms, flat panel displays, fiber optic gyroscopes (FOG), atomic interferometer sensors (AI), resonating gyroscopes, angular rate sensors and accelerometers, vacuum tubes, lighting, light bulbs, gas filters, solid-state vacuum pumps, micro-mirror arrays, particle accelerators, large vacuum systems, gas masks, personal protection air purification systems, atomic and resonant clocks, density meters, motion, pressure, IR, chemical and sensors, and rf-resonators for communication devices (RF-MEMS).

Figure 5:
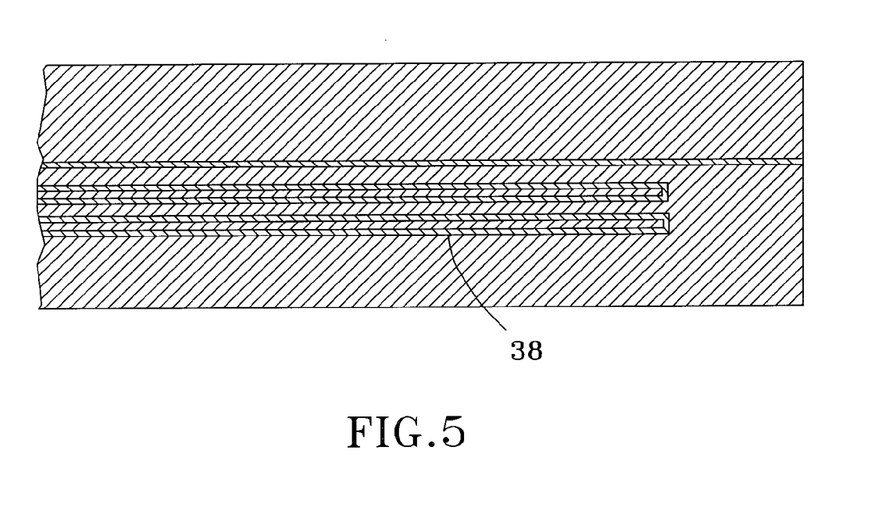
FIG. 5 represents a sensing element formed of a getter material to monitor the life and efficacy of a getter device in accordance with an embodiment of the present invention.

In addition to sealed packages of the type represented in FIG. 4, the concepts of this invention are also applicable to gettering gas species from gas streams, such as may be the case in a vacuum system, vacuum-packaged device, or gas purification system. In such applications, the lifetime or effectiveness of the getter device 10 can be monitored to provide data capable of indicating if the getter device 10 should be replaced or its getter material(s) regenerated by an activation treatment. Such a monitoring capability is useful for use with a wide variety of getter materials that can be employed to remove a wide variety of gas species, including any of the getter materials and gas species previously discussed. Monitoring can be performed in reference to changes in one or more physical properties of the getter material that occur due to its chemical reactivity. In a particular example in which oxygen and/or water vapor is gettered resulting in oxidation of the getter material surface, electrical resistance is one such property that can be monitored, since the electrical resistance of an oxide of a metallic getter material is typically much higher than that of the getter material itself. Based on this property, a metal film, filament, or wire formed of the same or similar getter material as used in the getter device 10 can be used as a reaction sensing element placed in the same environment as the device 10. Alternatively, for greater sensitivity, the sensing element may be formed of a material that is more chemically reactive than the getter material of the device 10. FIG. 5 shows an example of a suitable reaction sensing element 38 in the form of a serpentine resistor, though other forms are within the scope of the invention. While essentially a single surface of the sensing element 38 appears exposed in FIG. 5, additional surfaces can be exposed, such as by undercutting the sensing element 38 with etching techniques used in micromachining methods.

Figure 6:
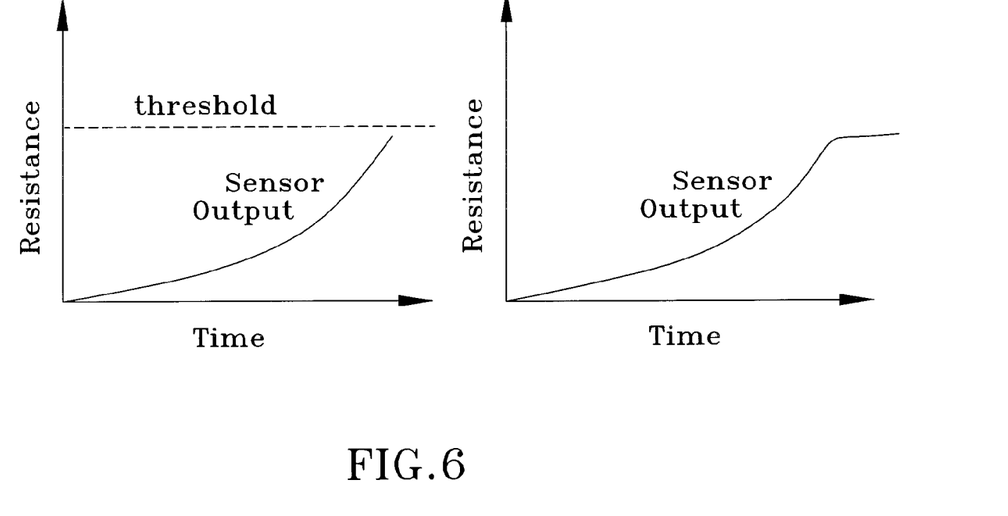
FIG. 6 shows two graphs representing typical changes in electrical properties that occur during the lives of getter devices.

As illustrated in FIG. 6, as an active gas reacts with a getter material (such as in the getter device 10 or the sensing element 38), a compound forms (e.g., an oxide, hydride or nitride compound, depending on the compositions of the active gas and getter material) that increases the electrical resistance of the getter material. By forming the sensing element 38 of the same or more reactive getter material as the getter device 10, when the electrical resistance of the sensing element 38 reaches a certain threshold, a signal such as an audible or visual warning can be generated to indicate that the getter device 10 should be changed or regenerated as a result of being subjected to the same active gas as the sensing element 38. FIG. 6 also shows a graph of the reaction behavior of a sensing element 38 that further includes a material that is resistant to the reaction being sensed by the sensing element 38. For example, a metal film, filament, or wire can be formed to contain a getter material and a relatively unreactive metal, metal alloy, or multi-metal strip(s). As a particular example, an oxidation-resistant noble metal layer can be combined with a more reactive getter material, such that the resistance of the sensing element 38 will approach but not exceed the resistance of the noble metal layer, as represented in FIG. 6. Based on this information, regeneration can be performed as necessary, such as with a vacuum, hydrogen or other reducing gas anneal, during which both the getter material of the getter device 10 and the getter material of the sensing element 38 can be regenerated and restored to or near their original capacity.

Resistive sensing elements 38 of the type described above can be formed as part of a bridge or Wheatstone bridge to increase sensitivity. Trimming of the sensing element 38 can also be performed to increase sensitivity and accuracy, and amplification and electronic circuits can be employed to boost and compensate the sensing element signal for temperature, voltage, and other effects. To facilitate the implementation of this concept, the sensing element 38 can be formed on an integrated circuit chip along with any signal compensation or conditioning circuitry, as well as other signal processing, memory, timing, data gathering and processing, and system functions.

If the electrical resistance of the getter material used in the sensing element 38 is sufficiently sensitive to temperature, the sensing element 38 can also be used to monitor the temperate of the environment in which the getter device 10 is operating. It should be noted that any number of sensing elements 38 of multiple different getter materials and configurations can be used, for example, to monitor the gettering of more than one gas species and to monitor changes in the getter capacity over time with respect to specific and/or different gases. In addition to resistance, other properties of a getter material can be sensed to monitor the getter capacity of the getter material. As an example, instead of a resistor, a sensing element can be in the form of a resonator whose resonant frequency changes over time as a result of absorption, adsorption, or reaction with a gas species. Another example is to form the sensing element as a capacitor, such as a lateral comb capacitor, in which changes in the dielectric constant of a getter material resulting from reaction with a gas species can be used to monitor getter capacity.

Figure 7:
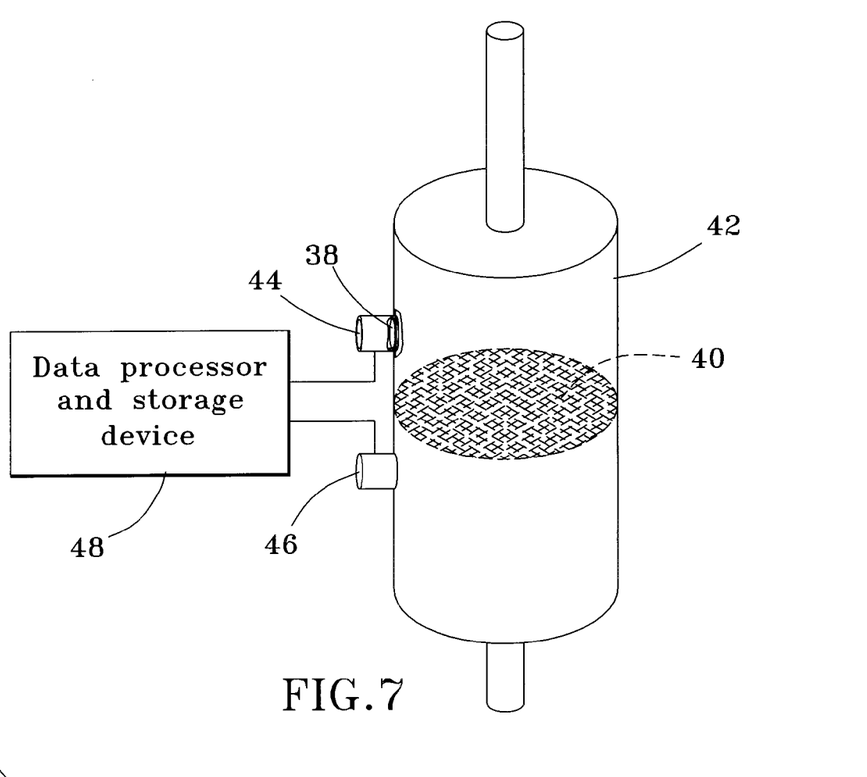
FIG. 7 schematically represents a flow-through cannister adapted to use a getter filter and make use of a device for monitoring the life and efficacy of the getter filter in accordance with an embodiment of the present invention.

FIG. 7 represents an extension of the concept discussed above, in which one or more gas species are gettered from a gas stream with a getter device located in a cannister 40 through which the gas stream flows. Such a getter device can be in accordance with any of the preceding embodiments. Alternatively, and as represented in FIG. 7, the getter device can be in the form of a getter filter 40 that may extend across the entire internal cross-section of the cannister 42. As discussed above, the lifetime or effectiveness of the getter filter 40 can be monitored by sensing physical properties, such as electrical resistance, capacitance, resonant frequency, temperature, etc., with a sensing element 38 represented in FIG. 7 as being part of a sensor 44 mounted to the cannister 42. FIG. 7 also represents another approach in which getter capacity can be monitored with a sensor 46 adapted to sense parameters indicative of the gas flow through the cannister 42. For example, the sensor 46 may be a pressure sensor and/or a flow sensor whose output changes as the flow rate through the getter filter 40 decreases, indicative that the filter 40 is nearing the end of its life due to accumulation of reaction products and/or absorbed gas molecules on the filter 40. A notable advantage of a getter filter 40 and its supporting sensors 44 and 46 over Suitable pressure sensor technologies for the sensor 46 include but are not limited to micromachined sensors using capacitive and piezoresistive sensing techniques. Suitable flow sensor technologies for the sensor 46 include but are not limited to hot-wire and thin-film hot anemometers. While shown as being at separate locations on the cannister 42, the sensors 44 and 46 could be combined with their respective sensing elements fabricated on the same substrate. For example, the sensing element 38 of the sensor 44 and sensing elements associated with the sensor 46 could be fabricated as a collection of thin film runners that together monitor the chemical reactivity of the filter 40 and the temperature, pressure, and/or flow rate within the cannister 42. The sensors 44 and 46 are shown in FIG. 7 as being connected to a device 48 capable of storing data obtained from the sensors 44 and 46 and, based on the data, determining if and when the filter 40 must be regenerated or changed and optionally generating an appropriate signal. This data can also be tracked and stored to accumulate historical data from which correlations can be drawn with other events that occur within the system containing the cannister 42. Finally, such data can be transmitted over a wire or wirelessly to a computer used to control or monitor the system.

Applications for the embodiment of FIG. 7 include those noted for previous embodiments, though with particular emphasis on those applications involving a flowing gas stream. As such, this embodiment is well suited for installation in gas stream purification processes, pipelines, and vacuum pumps, and as part of a gettering plate used as a wall panel in a vacuum system or chamber, such as in a particle accelerator, semiconductor processing equipment, and scientific analysis tools.

In applications where transparency to a particular type of radiation is required, the present invention further provides a getter material that is substantially transparent to the radiation of interest. Examples of such applications include optical (visible radiation) sensor windows, infrared (IR) sensor windows, display windows including cathode ray tube (CRT) screens used in consumer products, etc. According to this aspect of the invention, a getter material is applied to at least one surface of a window or display substrate. If intended for a window or display, the surface on which the getter material is deposited will subsequently become an interior surface of a sealed chamber, and radiation is transmitted through the substrate in a direction generally transverse to the surface on which the getter material is deposited. According to this aspect of the invention, the getter material getters one or more gas species within the sealed chamber while also permitting the transmission of the radiation though the surface of the substrate, including that portion of the surface coated by the getter material. The substrate material can vary depending on the particular application. Glass substrates are suitable for transmitting visible radiation, whereas substrate materials such as silicon, germanium, gallium arsenide, etc., are transparent to radiation of other wavelengths. Accordingly, the term "transparent" as used here in reference to substrate materials is not limited to transparency to wavelengths in the visible light spectrum.

Figure 8:
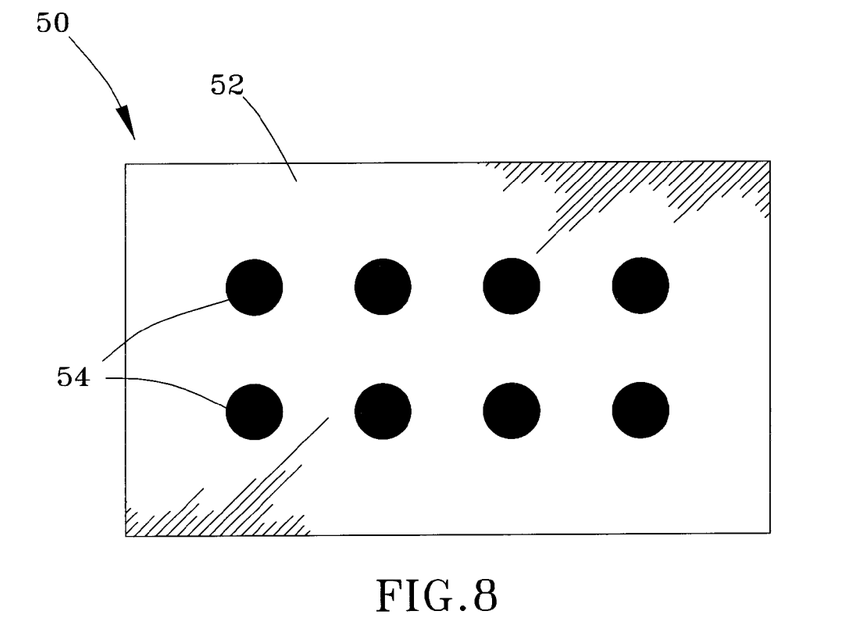
FIGS. 8, 9, and 10 schematically represent getter devices according to three additional embodiments of the present invention, in which the getter devices are sufficiently transparent to at least one type of radiation to permit the devices to be used as displays, windows, and other substrates through which the radiation must pass.

To achieve sufficient transparency, the getter material is deposited on the desired substrate material to be sufficiently thin and/or porous to minimize reflection of the radiation of interest. Thicknesses of less than 600 angstroms are believed necessary, with suitable results having been obtained with metallic getter materials deposited to thicknesses of about 300 angstroms. In certain applications, some amount of reflection may be beneficial to achieve a filter or one-way mirror effect. As represented in FIG. 8, suitable transparency can be achieved for a getter device 50 by patterning a getter material into islands 54 on a transparent substrate 52. The islands 54 can be nanometer-sized up to several millimeters in diameter or at their maximum dimension. The size and thickness of the islands 54, spacing between islands 54, and relative surface coverage of the islands (as a percentage of total window surface area) can be varied to optimize gettering performance and the optical performance of the substrate 52 as a function of radiation wavelength.

Figure 9:
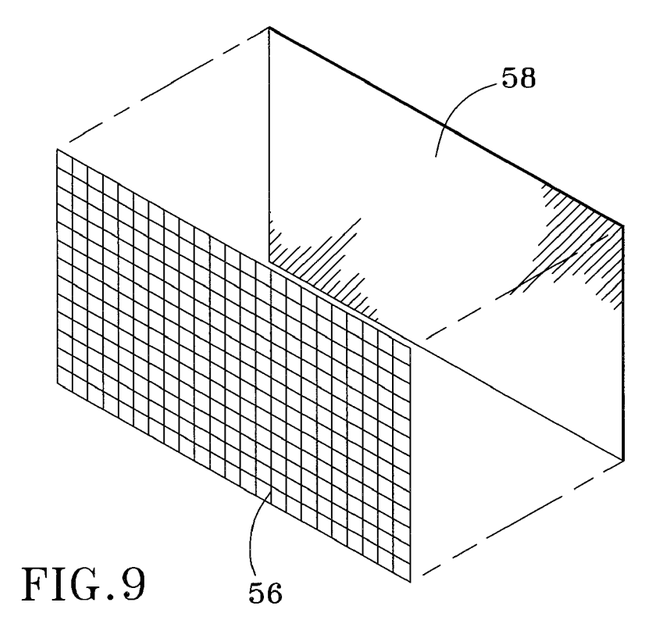

Though the islands 54 are shown in FIG. 8 as being completely isolated from each other, interconnected islands and other patterns are also within the scope of the invention, particularly if certain electrical characteristics are desired for the gettering material. The gettering material can be patterned using conventional photolithography methods employed by IC wafer processing, such as photoresist and etching, screen printing and etching, and lift-off photolithography methods. FIG. 9 represents a shadow mask 56 suitable for depositing a getter material (not shown) on a substrate 58 using evaporation and sputtering techniques. While a shadow mask in the form of a screen is illustrated in FIG. 9, machined plates can also be used, for example, to deposit the getter islands 54 in FIG. 8. Uniform getter material patterns are shown in FIGS. 8 and 9, though it is foreseeable that nonuniform patterns may be permitted or desired for certain application. For example, in FIG. 10, a getter device 60 is shown having patterned getter material 64 concentrated at the perimeter of a substrate 62, with getter material being absent at the center of the substrate 62.

Figure 10:
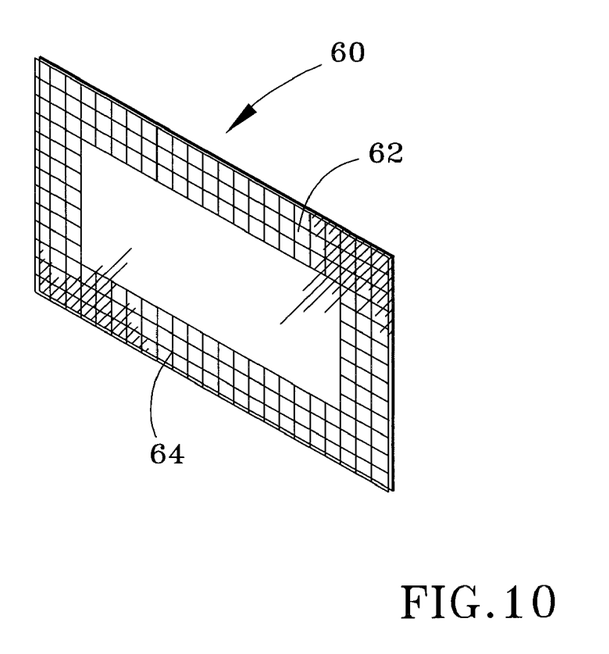

In typical windows and displays, the window or display is in the form of a sealed enclosure containing a getter material. Depending on the particular application, the enclosure may be under vacuum or contain an inert gas. The sealing operation may involve glass frit reflow, soldering, a eutectic reaction, welding, etc, in which case a heating step is performed during which the getter material may be activated and may absorb or combine with any gases within the enclosure, such as oxygen, water vapor, organic compounds, hydrogen, nitrogen, etc. As evident from the above discussions regarding the other embodiments of this invention, the getter devices of FIGS. 8, 9, and 10 are also compatible with such processing steps, and any number of steps can be performed to activate the getter material and improve its reactivity or absorptivity.

While the invention has been described in terms of a preferred embodiment, it is apparent that other forms could be adopted by one skilled in the art. Therefore, the scope of the invention is to be limited only by the following claims.

The invention claimed is:

1. A getter device comprising:
a substrate formed of a first getter material having a composition for gettering a first gas species, the substrate comprising an external surface and internal porosity connected to openings at the external surface; and
a second getter material deposited by a film deposition process on the external surface of the substrate so as to form an exposed film that adheres to the external surface, the second getter material having a composition for gettering a second gas species different from the first gas species, the film of the second getter material covering at least a portion of the external surface of the substrate and being absent from at least a portion of the internal porosity of the substrate so that the first getter material is exposed within the internal porosity of the substrate for gettering the first gas species within the internal porosity and the second getter material is exposed on the external surface of the substrate for gettering the second gas species at the external surface of the substrate.

2. The getter device according to claim 1, wherein the first gas species is an organic gas and the first getter material getters the first gas species by absorbing the organic gas, and the second gas species is an inorganic gas and the second getter material getters the second gas species by reacting with the inorganic gas.

3. The getter device according to claim 2, wherein the first getter material is chosen from the group consisting of activated charcoal, zeolite, silica gel, polymeric materials, molecular sieve materials, nonevaporable getters, sintered metallic powders, ceramics, and combinations thereof.

4. The getter device according to claim 2, wherein the second getter material is chosen from the group consisting of Group IA, IIA, IIIB, IVB, VB, VIB, VIIB, VIII, IB, IIB, IIIA, IVA elements in the periodic table, reactive transition metals, metal oxides, ceramics, carbon, carbon nanotubes, diamond, activated charcoal/carbon, and combinations thereof.

5. The getter device according to claim 4, wherein the second getter material is chosen from the group consisting of Ba, Mg, Ti, Zr, Fe, Cr, C, Ca, and combinations thereof.

6. The getter device according to claim 1, wherein the film of the second getter material covers at least a majority of the external surface of the substrate and is substantially absent from the internal porosity of the substrate.

7. The getter device according to claim 1, wherein the film is present on the external surface of the substrate in an amount sufficient to physically support and protect the substrate.

8. The getter device according to claim 1, wherein the film comprises membrane portions that cover at least some of the openings at the external surface of the substrate, at least some of the membrane portions being concave and sufficiently thin and/or porous to enable the first gas species to pass therethrough and enter the internal porosity of the substrate.

9. The getter device according to claim 8, wherein the membrane portions are sufficiently thick to retain particulate within the internal porosity of the substrate.

10. The getter device according to claim 1, further comprising a screen wrapped around the external surface of the substrate and the film thereon.

11. The getter device according to claim 10, wherein the screen is formed of a getter material.

12. A getter device comprising:
a substrate formed of a first getter material having a composition for gettering a first gas species, the substrate comprising an external surface and internal porosity connected to openings at the external surface;
a second getter material contacting the external surface of the substrate, the second getter material having a composition for gettering a second gas species different from the first gas species, the second getter material covering at least a portion of the external surface of the substrate and being absent from at least a portion of the internal porosity of the substrate so that the first getter material is exposed within the internal porosity of the substrate for gettering the first gas species and the second getter material is exposed on the external surface of the substrate for gettering the second gas species; and
a sensing element having a composition for gettering at least one of the first and second gas species, means for sensing a change in at least one property of the sensing element, and means for signaling that the change has exceeded a predetermined threshold for the property.

13. The getter device according to claim 12, wherein the sensing means senses the change in electrical resistance of the sensing element.

14. The getter device according to claim 12, wherein the sensing means senses the change in resonant frequency of the sensing element.

15. The getter device according to claim 12, wherein the sensing means senses the change in temperature of the sensing element.

16. An enclosure containing the getter device according to claim 1 and a gaseous substance within the enclosure whose composition is controlled at least in part by the first and second getter materials of the getter device.

17. The enclosure according to claim 16, wherein the enclosure comprises a sealed chamber.

18. The enclosure according to claim 16, wherein the gaseous substance is in a gas stream flowing through the enclosure.

19. The enclosure according to claim 18, further comprising means for monitoring flow of the gas stream through the enclosure.

20. The enclosure according to claim 19, further comprising means for signaling that the flow of the gas stream is below a predetermined threshold for the flow.

21. The enclosure according to claim 16, wherein the enclosure is a member of a device chosen from the group consisting of micromachined devices, vacuum tubes, cathode ray tubes, vacuum display devices, flat panel displays, resonant sensors, tunneling sensors, flow sensors, motion sensors, gyroscopes, pressure sensors, infrared sensors, chemical sensors, atomic interferometer sensors, resonators, ion accelerators, lighting devices, gas filters, solid-state vacuum pumps, micro-mirror arrays, personal protection air purification systems, density meters, rf-resonators for communication devices, gas purification systems, atomic and resonant clocks, semiconductor equipment, and scientific vacuum systems.

22. A device comprising:
a substrate transparent to at least one type of radiation, the substrate being exposed to the at least one type of radiation and the at least one type of radiation passing through the substrate from a first surface thereof to a second surface thereof; and
a film exposed on at least a surface portion of at least one of the first and second surfaces of the substrate, the film being formed of a getter material so that an exposed surface of the film reacts or absorbs a gas species, the film being sufficiently thin and/or porous so that the film on the surface portion is also transparent to the at least one type of radiation and the at least one type of radiation transmitted through the substrate is also transmitted through the film on the surface portion and through the exposed surface of the film.

23. The device according to claim 22, wherein the portion of the film is not thicker than about 600 angstroms.

24. The device according to claim 23, wherein the portion of the film comprises isolated islands of the getter material having maximum dimensions of less than a centimeter.

25. The device according to claim 22, wherein the film is formed of at least one material chosen from the group consisting of Group IA, IIA, IIIB, IVB, VB, VIB, VIIB, VIII, IB, IIB, IIIA, IVA elements in the periodic table, reactive transition metals, metal oxides, ceramics, carbon, carbon nanotubes, diamond, activated charcoal/carbon, and combinations thereof.

26. The device according to claim 22, wherein the substrate is a display or window.

27. The device according to claim 22, wherein the at least one type of radiation is chosen from the group consisting of infrared and visible radiation.

* * * * *